United States Patent [19]
Naruse et al.

[11] Patent Number: 5,624,781
[45] Date of Patent: Apr. 29, 1997

[54] POSITIVE TYPE ANIONIC ELECTRODEPOSITION PHOTO-RESIST COMPOSITION AND PROCESS FOR PATTERN FORMATION USING SAID COMPOSITION

[75] Inventors: Keisuke Naruse; Yukari Takeda; Naozumi Iwasawa, all of Hiratsuka; Hideo Kogure, Atsugi, all of Japan

[73] Assignee: Kansai Paint Co., Ltd., Hyogo-ken, Japan

[21] Appl. No.: 250,623

[22] Filed: May 27, 1994

[30] Foreign Application Priority Data

May 28, 1993 [JP] Japan ................... 5-148415

[51] Int. Cl.$^6$ ............... G03F 7/023; G03F 7/38; G03F 7/40; C25D 13/00
[52] U.S. Cl. ............ 430/192; 430/18; 430/165; 430/191; 430/193; 430/313; 430/318; 430/329; 430/330; 204/181.6; 204/181.7
[58] Field of Search ................ 430/192, 193, 430/165, 191, 313, 318, 329, 330, 18; 204/181.6, 181.7

[56] References Cited

U.S. PATENT DOCUMENTS

| | | | |
|---|---|---|---|
| 4,384,037 | 5/1983 | Hosaka et al. | 430/192 |
| 4,673,458 | 6/1987 | Ishikawa et al. | 156/659.1 |
| 4,975,351 | 12/1990 | Akaki et al. | 430/190 |
| 5,002,858 | 3/1991 | Demmer et al. | 430/325 |
| 5,055,374 | 10/1991 | Seio et al. | 430/190 |
| 5,080,998 | 1/1992 | Irving et al. | 430/169 |
| 5,134,054 | 7/1992 | Iwasawa et al. | 430/192 |
| 5,166,036 | 11/1992 | Seio et al. | 430/313 |
| 5,422,222 | 6/1995 | Akaki et al. | 430/192 |
| 5,518,859 | 5/1996 | Iwasawa et al. | 430/192 |

FOREIGN PATENT DOCUMENTS

| | | |
|---|---|---|
| 3-100073 | 4/1991 | Japan. |
| 3-100074 | 4/1991 | Japan. |
| 3-281671 | 12/1991 | Japan. |

*Primary Examiner*—John S. Chu
*Attorney, Agent, or Firm*—Wenderoth, Lind & Ponack

[57] ABSTRACT

A positive type anionic electrodeposition photoresist composition comprising, as a main component, a dispersion obtained by neutralizing, with a base, a mixture comprising:

(A) an acrylic resin containing carboxyl group(s) and hydroxyl group(s), (B) a vinylphenol resin containing a hydroxystyrene unit in an amount of at least 25% by weight based on the resin, and (C) an ester between a polyhydroxybenzophenone and 1,2-naphthoquinone diazide sulfonic acid or benzoquinone diazide sulfonic acid, and dispersing the resulting neutralization product in water.

This composition is superior in running stability during electrodeposition and is useful for formation of highly reliable resist pattern or conductor pattern.

23 Claims, No Drawings

POSITIVE TYPE ANIONIC ELECTRODEPOSITION PHOTO-RESIST COMPOSITION AND PROCESS FOR PATTERN FORMATION USING SAID COMPOSITION

BACKGROUND OF THE INVENTION

1. Field of the Invention

The present invention relates to a positive type anionic electrodeposition photoresist composition having excellent running stability during electrodeposition and good coatability, which is suitable for use as a resist enabling formation of highly reliable conductor image, particularly as an etching resist for production of printed wiring board, as well as to a process for pattern formation using said resist composition.

2. Description of the Prior Art

The printed wiring boards used in electronic apparatuses, etc. are produced mainly by (a) a pattern printing process which comprises conducting screen printing on an insulating substrate having a conductor layer on the surface and (b) a substractive process which uses a circuit pattern formed by photolithography using a photosensitive dry film. With the recent technical advancement to a higher density and a higher accuracy, however, the printed wiring boards are required to have a finer circuit pattern and a smaller through-hole diameter. To meet such requirements, there were proposed various processes for production of printed wiring board using a positive type electrodeposition photoresist.

As compositions capable of forming a positive type electrodeposition photoresist, there were proposed water-soluble or water-dispersible compositions such as a composition using, as a main component, a resin obtained by bonding a quinone diazide sulfonic acid to a base resin (e.g. an acrylic resin having an ion-forming group) via a sulfonic acid ester bond (U.S. Pat. No. 4,673,458); a composition using, as a main component, a resin obtained by bonding hydroxylamine and quinone diazide sulfonic acid to a base resin (e.g. an acrylic resin having an ion-forming group) via a urethane bond and a sulfonimide bond (U.S. Pat. No. 4,975,351); a composition using, as a main component, a photosensitizer mixture obtained by reacting an acrylic resin obtained by copolymerizing a polymerizable monomer having a relatively long side chain having, at the end, an acid group (e.g. a carboxy group), with an epoxy compound, a phenolic hydroxyl group-containing aromatic or heterocyclic carboxylic acid and quinone diazide sulfonic acid halide (U.S. Pat. Nos. 5,055,374 and 5,166,036); a composition obtained by mixing a base resin (e.g. an acrylic resin having an ion-forming group) with a compound or resin obtained by bonding hydroxylamine and quinone diazide sulfonic acid to a compound or resin having a hydroxyl group, via a urethane bond and a sulfonimide bond (U.S. Pat. No. 5,134,054); a composition using, as a main component, a photosensitive resin having a phenolic hydroxyl group and a carboxyl group or an amino group in the polymer molecule, in which resin a quinone diazide sulfonic acid is introduced via a sulfonic acid ester bond (U.S. Pat. No. 4,673,458); a composition obtained by mixing a carboxyl group-containing polymer with a phenolic hydroxyl group-containing polymer in which quinone diazide sulfonic acid is introduced via a sulfonic acid ester bond [U.S. Pat. No. 5,080,998 and Japanese Patent Application Kokai (Laid-Open) No. 100073/1991]; a composition using, as a main component, a mixture of a carboxyl group-containing acrylic acid and a sulfonic acid ester between a phenolic hydroxyl group-containing aromatic carboxylic acid ester and quinone diazide [Japanese Patent Application Kokai (Laid-Open) No. 100074/1991]; and a positive type electro-deposition resist composition comprising a block. copolymer composed of a carboxyl group-free polymer segment and a carboxyl group-containing polymer segment, an alkali-soluble polyphenol and a positive type photosensitizer, and a resist composition obtained by, in the above resist composition, bonding the photosensitizer to other component [Japanese Patent Application Kokai (Laid-Open) No. 281671/1991].

The above conventional compositions, however, have the following problems, and solutions thereto are needed.

That is, in the resin systems in which a photo-sensitive group is introduced via a sulfonic acid ester group, it is necessary to subject the hydroxyl group (e.g. a phenolic hydroxyl group) of a resin and a sulfonic acid halide to dehydrohalogenation to form a sulfonic acid ester and thereby introduce a quinone diazide group. This reaction is a polymer reaction, wherein it is difficult to introduce a photosensitive group quantitatively. In the reaction, it is also difficult to remove, after the reaction, a halogenic acid salt (a by-product) and purify the product; the production time is long; thus, the reaction is not favorable for industrial use.

To avoid the formation of by-product in the above polymer reaction, there is a system using a resin obtained by reaction a naphthoquinone diazide sulfonic acid halide with hydroxylamine via a sulfonamide bond, reacting the reaction product with a diisocyanate (e.g. toluene diisocyanate), and reacting the resulting intermediate having a photosensitive group and an residual isocyanate group, with a hydroxyl group-containing resin. This system is favorable in that the yield in polymer reaction is high and that no purification step is required, but has problems in that the steps up to production of intermediate are complicated and require a long time.

In the above systems using a resin in which a photosensitive group is introduced, the photosensitive group is located randomly in the resin; therefore, when the system is made into an aqueous dispersion, the resin portion containing a photosensitive group of high hydrophobicity is easily present on the surface of dispersed particles. As a result, the aqueous dispersion has low stability and tends to generate a deposit; the azide group contacts easily with a basic substance (e.g. an amine) present in the aqueous layer in a large amount and is decomposed, resulting in reduced photosensitivity. Thus, the systems have a big drawback as an electrodeposition resist which must have long-term stability when made into an aqueous dispersion.

Meanwhile, in the systems using a resin in which a photosensitive group is introduced via a sulfonic acid ester group, the sulfonic acid ester group is hydrolyzed easily; therefore, the systems, when used as an electrodeposition resist solution, have even lower stability during storage and during running. In the system using a resin in which a photosensitive group is introduced via a sulfonic acid imide bond and a urethane bond, the problem associated with hydrolysis is significantly improved, but the exposed resist portion is slow in dissolution in developer and the development must be conducted at high temperatures.

In order to solve the above problems, there was proposed an electrodeposition resist which is an aqueous dispersion of a composition comprising a water-soluble or water-dispersible resin and a quinone diazide type photosensitizer. There were proposed, for example, (1) a composition comprising an alkali-soluble resin (e.g. a phenolic resin) (this alkali-soluble resin is in use in LSI production) and a naphthoquinone diazide sulfonic acid ester of a polyhydroxybenzophenone, and (2) a composition obtained by using, in the above composition (1), a water-soluble or water-dispersible resin (e.g. an acrylic resin) in place of the phenolic resin (his phenolic resin is not preferable for use in an electrodeposition resist for production of printed circuit board, in view of the water-dispersibility and the properties of the film formed therewith). With these compositions, however, their aqueous dispersions have no sufficient stability and generate a deposit easily; in the aqueous dispersions, since part of the photosensitizer is present on the surface of dispersed particles, the azide group of the photosensitizer contacts with a basic substance, resulting in its decomposition and consequent reduction in photosensitivity. Further, when a photosensitizer of sulfonic acid ester type is used, the sulfonic acid ester is hydrolyzed, resulting in reduction in stability of aqueous dispersion; thus, it is difficult to obtain an electrodeposition resist solution having excellent running stability over a long term.

In order to improve the stability of an aqueous dispersion, it was proposed to use a comb-structured acrylic resin obtained by copolymerization of a particular monomer of relatively long chain polyester or polyether type having an acid group at one end and a polymerizable unsaturated group at the other end (in said resin, the ion-forming group is distant from the resin skeleton which is hydrophobic) and thereby allow a highly hydrophobic quinone diazide type photosensitizer to be easily present inside the resin particles dispersed in water.

By this approach, there can be obtained an aqueous dispersion having a considerably improved storage stability, but its running stability over a long term is not sufficient. Further, in order to obtain said acrylic resin, a special monomer must be be used and the process for production thereof is complicated and requires a long time.

Furthermore, said monomer has a relatively large molecular weight and has a low copolymerizability with ordinary acrylic ester type monomers, etc., and tends to remain unreacted in produced resin or form a homopolymer. The unreacted monomer and homopolymer tend to act as water-soluble components when being in an aqueous dispersion and enables the formation of an aqueous dispersion of relatively good storage stability. The aqueous dispersion, however, is not sufficient as an electrodeposition resist because, when it is used in electrodeposition and there is conducted circulation of electrodeposition solution by pump (this is requisite in electrodeposition), the dispersed resin particles tend to cause fusion with each other and generate an agglomerate in the solution, which easily causes (1) deposition of said agglomerate on formed resist film and (2) plugging of filter used in circulation system.

Also in an electrodeposition resist which is an aqueous dispersion of a mixture comprising a carboxyl group-containing polymer and a photosensitizer obtained by introducing a quinone diazide type photosensitive group to a phenolic hydroxyl group-containing polymer (e.g. a polyvinylphenol) via a sulfonic acid ester bond, the running stability is insufficient and the photosensitizer used therein, which is a product of polymer reaction, has problems as mentioned previously.

With a composition which uses, as an acrylic resin, a block copolymer composed of an ion-forming group-containing segment-and an ion-forming group-free segment and further comprises an alkali-soluble phenolic resin and a photosensitizer, there can be formed a resist pattern of good resolution; however, in order to obtain such an acrylic resin, an expensive polymerization initiator must be used and the production process is complicated, both of which are very disadvantageous economically.

Moreover, the resist film obtained by conducting electrocoating using any of these compositions has various drawbacks. That is, the resist film is low in contrast (difference in solubility in developer between exposed portion and unexposed portion); can be subjected to development only under limited development conditions (temperature and time); and has no sufficient etchant resistance and, when the copper or circuit substrate to be etched has a large thickness, must be etched under severe etching conditions (long time and/or high temperature), resulting in easy attack of resist film and consequent easy appearance of defect in circuit pattern or through-holes.

Hence, the present inventors made an extensive study in order to develop a positive type electrodeposition photoresist composition which can be produced without using any complicated and long reaction or any complicated process, which can be made into an electrodeposition resist solution of excellent storage stability and circulation stability and can give an electrodeposition solution of high running stability even at a low-turnover speed, and which can form a resist film of high contrast and excellent etchant resistance, as well as a process for formation of highly reliable pattern using said composition. As a result, it was found that a composition, which can solve all the problems mentioned above, can be obtained by mixing a particular water-soluble or water-dispersible acrylic resin, a resin having a hydroxystyrene unit and an ester between quinone diazide sulfonic acid and a polyhydroxybenzophenone to prepare a composition, neutralizing part or all of the carboxyl groups of the composition with a basic substance and dispersing the neutralization product in water, and further that, by using said composition, a highly reliable pattern can be formed. The finding has let to the completion of the present invention.

SUMMARY OF THE INVENTION

According to the present invention, there are provided a positive type anionic electrodeposition photoresist composition comprising, as a main component, a water-dispersible resin composition obtained by neutralizing, with a base, a mixture comprising:

(A) an acrylic resin containing carboxyl group(s) in an amount of 0.7–3.5 moles per kg of the resin and hydroxyl group(s) in an amount of 0.5–3.5 moles per kg of the resin and having a number-average molecular weight of 10,000–100,000, (B) a vinylphenol resin containing a unit represented by formula (I)

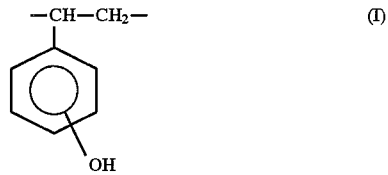

in an amount of at least 25% by weight based on the resin and having a number-average molecular weight of 1,000–25,000, and (C) an ester between a polyhydroxybenzophenone and 1,2-naphthoquinone diazide sulfonic acid or benzoquinone diazide sulfonic acid, and dispersing the resulting neutralization product in water;

a process for formation of resist pattern, which comprises:

(a) a step of electrocoating of electrodeposition photoresist composition mentioned above, on a substrate having a conductive film thereon or on a metal to form a positive photosensitive film, (b) a step of irradiating the positive photosensitive film with a light via a pattern mask, (c) a step of heating the light-irradiated photosensitive film, and (d) a step of removing the light-irradiated portion of the film with an alkaline developer to form a pattern; and a process for formation of conductor pattern, which comprises in addition to the above steps (a) to (d):

(e) a step of removing the exposed conductive film or the exposed metal by etching, and (f) a step of removing the photosensitive film remaining on the pattern.

In the electrodeposition photoresist composition of the present invention, by neutralizing the mixture of the components (A), (B) and (C) with a base to obtain an aqueous dispersion, the acrylic resin (A) acts as a dispersion stabilizer, and the hydrophobic component (B) and the more hydrophobic component (C) become the core components of water-dispersed particles. The component (B) has compatibility with the components (A) and (C) and is very effective for formation of stable dispersed particles. Further, when a resist film is formed with the present composition, then subjected to light exposure and heated, the component (B) present in the unexposed film portion reacts with naphthoquinone diazide and becomes insoluble in the developer used, significantly increasing resist pattern contrast and etchant resistance.

DETAILED DESCRIPTION OF THE INVENTION

The electrodeposition photoresist composition of the present invention and the process for pattern formation using said composition are hereinafter described in more detail.

Acrylic resin (A)

The acrylic resin (A) used in the electrodeposition photoresist composition of the present invention is an acrylic resin containing carboxyl group(s) in an amount of 0.7–3.5 moles, preferably 1–2.5 moles per kg of the resin and hydroxyl group(s) in an amount of 0.5–3.5 moles, preferably 0.75–3.2 moles, more preferably 0.8–3.0 moles per kg of the resin and having a number-average molecular weight of 10,000–100,000, preferably 20,000–70,000, more preferably 20,000–60,000.

The acrylic resin (A) can be obtained, for example, by copolymerizing a carboxyl group-containing unsaturated monomer, a hydroxyl group-containing unsaturated monomer and, as necessary, other copolymerizable monomer in the presence of a polymerization catalyst and preferably in the present of an organic solvent by a per se known process.

The carboxyl group-containing unsaturated monomer used in the copolymerization includes, for example, unsaturated carboxylic acids such as (meth)acrylic acid, crotonic acid, itaconic acid, maleic acid and the like; and half-esters between a hydroxyl group-containing unsaturated monomer described below and a carboxylic acid anhydride (e.g. phthatic acid anhydride, tetrahydrophthalic acid anhydride, hexahydrophthalic acid anhydride, or trimellitic acid anhydride). The hydroxyl acid-containing unsaturated monomer includes, for example, $C_{1-12}$ hydroxyalkyl esters of (meth)acrylic acid, such as hydroxyethyl (meth)acrylate, hydroxypropyl (meth)acrylate and the like; and unsaturated alcohols such as allyl alcohol and the like.

The other copolymerizable monomer includes, for example, $C_{1-18}$ alkyl or cycloalkyl esters of (meth)acrylic acid, such as methyl (meth)acrylate, ethyl (meth)acrylate, propyl (meth)acrylate, n-butyl (meth)acrylate, isobutyl (meth)acrylate, tert-butyl (meth)acrylate, 2-ethylhexyl (meth)acrylate, cyclohexyl (meth)acrylate, n-octyl (meth) acrylate, lauryl (meth)acrylate, dodecyl (meth)acrylate, stearyl (meth)acrylate, isobornyl (meth)acrylate and the like; vinyl aromatic compounds such as styrene, α-methylstyrene, vinyltoluene, p-chlorostyrene, p-tert-butylstyrene and the like; polymerizable amides such as acrylamide, methacrylamide, N-methyl(meth)acrylamide, N-ethyl(meth)acrylamide, N,N-dimethyl(meth)acrylamide and the like; polymerizable nitriles such as acrylonitrile, methacrylonitrile and the like; vinyl esters such as vinyl acetate, vinyl propionate, vinyl lactate, vinyl butyrate, vinyl isobutyrate, vinyl caproate, vinyl isocaparoate, vinyl pyvalate, vinyl caprate, VeoVa monomer (a product of Shell Chemical Co.) and the like; propenyl esters such as isopropenyl acetate, isopropenyl propionate and the like; and monomers represented by the following formula

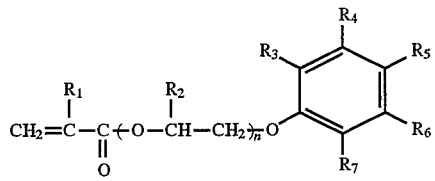

wherein n is an integer of 1–9, $R_1$ and $R_2$ are each a hydrogen atom or a methyl group, $R_3$ to $R_7$ are each a hydrogen atom, an alkyl group of 1–10 carbon atoms, a benzyl group or a halogen atom.

The organic solvent used in the copolymerization has no particular restriction as long as it can dissolve the acrylic resin formed. There can be used, for example, $C_{1-8}$ straight-chain or branched chain alkyl alcohols; mono- or diethers between a $C_{1-8}$ straight-chain or branched chain alcohol and a glycol (e.g. ethylene glycol, propylene glycol or butylene glycol) or a dimer thereof; mono- or diethers between a glycol (e.g. ethylene glycol, propylene glycol or butylene glycol) or a dimer thereof and phenol or a $C_{1-12}$ alkyl-substituted phenol; esters between a monohydroxy compound mentioned above and a $C_{1-4}$ carboxylic acid; glycols and dimers thereof, all mentioned above; ketones such as acetone, methyl ethyl ketone, methyl butyl ketone, dibutyl ketone, cyclohexanone, isophorone and the like; carbonates such as ethylene carbonate, propylene carbonate and the like; pyrrolidones such as N-methylpyrrolidone and the like; and aromatic hydrocarbons such as toluene, xylene, ethylbenzene and the like. These organic solvents can be used singly or in combination of two or more. Of these organic solvents, particularly preferable are those which are water-soluble per se or those in which at least 50% by weight of the components are water-soluble.

The proportions of the monomers used are determined so that the formed acrylic resin (A) contains carboxyl group(s) and hydroxyl group(s) in the above-mentioned amounts, respectively.

In the acrylic resin (A), when the carboxyl group content is less than 0.7 moles per kg of the resin and/or the hydroxyl group content is less than 0.5 moles per kg of the resin, the water-dispersibility of the resin is insufficient and the resulting aqueous dispersion tends to have low stability. Meanwhile, when the carboxyl group content is more than 3.5 moles per kg of the resin, the resin has too high a water solubility and has no sufficient ability for holding the components (B) and (C) inside the dispersed particles; and the amount of water-soluble components in dispersion is large, whereby the dispersion tends to have low storage and circulation stabilities. When the hydroxyl group content is more than 3.5 moles per kg of the resin, the unexposed portion of resist film causes high swelling during the development, which tends to invite reduction in resolution as well as reduction in etchant resistance of formed resist pattern. When the acrylic resin (A) has a number-average molecular weight smaller than 10,000, the resulting dispersion has low stability and the formed resist film has low properties, which tends to invite appearance of defects in the resist film during etching. Meanwhile, when the molecular weight is larger than 100,000, the resin has too high a viscosity, making difficult the synthesis of the resin and its dispersion in water.

Vinylphenol resin (B)

The vinylphenol resin (B) used in the electrodeposition photoresist composition of the present invention is a resin containing a hydroxystyrene unit represented by formula (I)

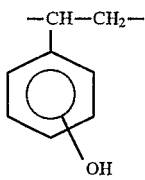

(I)

in an amount of at least 25% by weight, preferably 30–100% by weight, more preferably 40–100% by weight and having a number-average molecular weight of 1,000–25,000, preferably 2,500–20,000, more preferably 3,500–17,000.

The resin (B) includes, for example, homopolymers of hydroxystyrene (e.g. p-hydroxystyrene) and copolymers of hydroxystyrene and other copolymerizable monomer. The other copolymerizable monomer may be the same as mentioned in the production of the acrylic resin (A).

When there is used, as the resin (B), the copolymer mentioned above and the content of hydroxystyrene unit in copolymer is less than 25% by weight, the insolubilization reaction taking place during heating after light exposure, in the unexposed portion of the resist film formed, is insufficient and, in general, no desired effect is obtained. When the resin (B) has a number-average molecular weight smaller than 1,000, the formed resist film has insufficient properties, which tends to invite low adhesion of resist film to substrate and appearance of defect in resist film during etching. Meanwhile, when the molecular weight is larger than 25,000, the resulting resin tends to have low solubility in solvent and low compatibility with other components.

Quinone diazide sulfonic acid ester (C)

The quinone diazide sulfonic acid ester (C) used as a photosensitive component in the electrodeposition photoresist composition of the present invention is an ester between a polyhydroxybenzophenone and 1,2-naphthoquinone diazide sulfonic acid or benzoquinone diazide sulfonic acid.

The polyhydroxybenzophenone used in formation of the above ester includes those represented by formula (II)

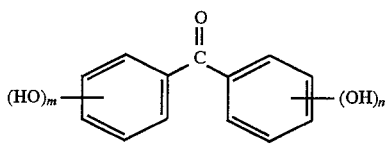

(II)

wherein m and n are each an integer of 0–3 with the total of m and n being 1–6. Specific examples of the polyhydroxybenzophenone and 2,3,4-trihydroxybenzophenone and 2,3,4,4'-tetrahydroxybenzophenone.

The 1,2-naphthoquinone diazide sulfonic acid and benzophenone diazide sulfonic acid to be esterified with the polyhydroxybenzophenone, include those presented by formula (III) and formula (IV), respectively.

$$\text{(III)}$$

$$\text{(IV)}$$

Specific examples of the above sulfonic acids are 1,2-naphthoquinone diazide-5-sulfonic acid, 1,2-naphthoquinone-4-sulfonic acid and 1,2-benzoquinone diazide-4-sulfonic acid.

The esterification between the polyhydroxybenzophenone and the 1,2-quinone diazide sulfonic acid can be conducted by a per se known process, for example, by reacting a polyhydroxybenzophenone and 1,2-quinone diazide sulfonic acid or a halide (e.g. chloride) thereof. At that time, the conversions of the two materials are not particularly restricted but it is generally preferable to react q hydroxyl groups (of polyhydroxybenzophenone) with 1 to q moles of a 1,2-quinone diazide sulfonic acid. The above-mentioned polyhydroxybenzophenones and quinone diazide compounds can be used singly or in combination of two or more.

Electrodeposition photoresist composition

The electrodeposition photoresist composition of the present invention comprises, as essential components, three components, i.e. the acrylic resin (A), the vinylphenol resin (B) and the quinone diazide sulfonic acid ester (C).

The proportions of the three components used in the present composition are not strictly restricted and can be varied depending upon the application of the composition, the kinds of the three components, etc.

The preferable proportion of the vinylphenol resin (B) is 5–550 parts by weight, particularly 5–450 parts by weight, more particularly 25–350 parts by weight per 1,000 parts by weight of the total of the components (A), (B) and (C). The preferable proportion of the quinone diazide sulfonic acid ester (C) is 15–450 parts by weight, particularly 15–350 parts by weight, more particularly 25–250 parts by weight per 1,000 parts by weight of the total of the three components (A), (B) and (C).

In the present composition, when the carboxyl group content is too low, the resulting aqueous dispersion tends to be unstable. When the carboxyl group content is too high, the Coulomb yield during electrodeposition of the resulting composition is low, resulting in easy appearance of pinholes, etc. on the electro-deposited surface. Accordingly, the preferable carboxyl group content in the present composition is generally 0.33–3.3 moles, preferably 0.50–2.5 moles, more preferably 0.6–2.0 moles per 1,000 g of the total of the three components (A), (B) and (C).

The preferable total content of carboxyl group(s) and non-phenolic hydroxyl group(s) is generally 0.6–6 moles, particularly 0.6–4.5 moles, more particularly 0.6–3.0 moles per 1,000 g of the total of the three components (A), (B) and (C) in view of the solubility of exposed portion of resist film in developer, the contrast and resolution of formed image, etc.

Herein, "non-phenolic hydroxyl group" refers to a hydroxyl group not directly bonding to any aromatic ring.

The electrodeposition photoresist composition of the present invention can be prepared by mixing the acrylic resin (A), the vinylphenol resin (B) and the quinone diazide sulfonic acid ester (C) at the above-mentioned proportions, neutralizing the resulting mixture with a base, and dispersing the neutralization product in water.

The base used in the neutralization is not particularly restricted as long as it has no adverse effect on the electrodeposition operation, and can be selected from bases of wide range. The base includes, for example, triethylamine, monoethanolamine, diethanolamine, diisopropylamine, dimethylaminoethanol, morpholine, ammonia and sodium hydroxide. Generally, the neutralization is conducted to such an extent that 25–100%, particularly 35–95% of the carboxyl groups present in the mixture is neutralized.

The dispersion of the neutralization product in water is conducted by various methods, for example, a method in which the neutralization product of the mixture of the components (A), (B) and (C) is dispersed in water; a method in which water is added to the neutralization product and dispersion is conducted; and a method in which the mixture of the components (A), (B) and (C) is added to water containing a base and dispersion is conducted; and a method in which water containing a base is added to the mixture and dispersion is conducted. The thus obtained dispersion has a wide solid content of 0.5–40% by weight and has good storage stability and circulation stability.

The composition of the present invention may comprise an organic solvent as necessary to dissolve the resin components and the photosensitizer component contained therein, or to control the flow leveling property or thickness of the film obtained by the electrocoating of the composition. The organic solvent is not particularly restricted and includes hydrophilic organic solvents such as lower alcohols (e.g. ethanol, propanol and butanol); mono-ethers between a glycol [e.g. (di)ethylene glycol or (di)propylene glycol] and methanol, ethanol, propanol, butanol or the like; diethers between said glycol and said alcohol; methyl ethyl ketone; tetrahydrofuran; and dimethylformamide, as well as hydrophobic organic solvents such as higher alcohols (e.g. hexyl alcohol, octyl alcohol and benzyl alcohol); monoethers between said glycol and hexanol, octanol or phenol; diethers between said glycol and hexyl alcohol, octyl alcohol or benzyl alcohol; ketones (e.g. methyl isobutyl ketone, cyclohexanone and isophorone); and aromatic hydrocarbons (e.g. toluene, xylene and ethylbenzene). The hydrophilic organic solvents are effective particularly for the dissolution of resins and photosensitizer and the control of flow leveling property, and are preferably used in an amount of generally 200 parts by weight or less, particularly 125 parts by weight or less per 100 parts by weight of the total of the three components (A), (B) and (C). The hydrophobic solvents are effective particularly for the control of film thickness, and are preferably used in an amount of generally 50 parts by weight or less, particularly 30 parts by weight or less per 100 parts by weight of the total of the three components (A), (B) and (C).

The electrodeposition photoresist composition of the present invention may furthermore comprise, as necessary, additives such as surfactant, flow leveling property-controlling agent, chelating agent and the like, and coloring agents such as pigment, dye and the like.

The solid content of the present composition is not particularly restricted but is generally 3–40% by weight. While an electrocoating bath generally has a solid content of 3–20% by weight, an aqueous dispersion must be prepared so as to have a solid content of generally about 1.5–2.0 times the solid content of the electrocoating bath so that the electrocoating bath can maintain a given concentration. It is very important that the aqueous dispersion has good stability in the above concentration range in order to obtain excellent running stability.

The electrodeposition photoresist composition of the present invention is easy to produce, is economical, and can provide an electrocoating bath of excellent running stability.

The positive type electrodeposition photoresist composition of the present invention is very useful for formation of resist pattern or conductor pattern. The pattern formation can be carried out, for example, as follows.

Formation of pattern

The present composition is made into an electrocoating bath having a solid content of 3–20% by weight. In the electrocoating bath is immersed, as an anode, a circuit substrate having a conductive film (e.g. a copper foil), or a metal substrate (e.g. a copper foil, a copper alloy foil or a stainless steel foil). A direct current of constant voltage or constant current density is applied between the anode and a cathode to coat the present composition on the substrate by electrodeposition. The application of direct current may also be conducted by combination of the above two methods. Also, a method may be used in combination in which the voltage or current density is increased slowly at an initial stage to a predetermined value.

In the case of applying a direct current of constant voltage, the voltage can be generally in the range of 10–300 V. In the case of applying a direct current of constant current density, the current density can be generally in the range of 10–200 mA/dm$^2$. The time of current application is generally about 20 seconds to about 10 minutes and, in this time period, a positive type photosensitive film is formed on the substrate. The thickness of the film can be generally 2–50 μm, preferably 3–20 μm in terms of dry film thickness.

After the completion of electrocoating, the coated substrate is taken-out from the electrocoating bath, washed with water, and dried with hot air or the like. The positive type photosensitive film on the substrate is irradiated with an actinic ray (e.g. an ultraviolet light) via a pattern mask (e.g. a photographic positive).

As the actinic ray, there is generally used one having a wavelength of 3,000–4,500 Å. The source therefor includes, for example, a sunlight, a mercury lamp, a xenon lamp or an arc lamp.

After the irradiation with an actinic ray, the photosensitive film is heated at a temperature of generally about 100° C. or higher, preferably about 120°–180° C. or higher for about 1–60 minutes. Thereby, the solubility of unexposed film portion to developer is lowered; the contrast between unexposed and exposed film portions is increased; as a result, the ranges of development conditions can be widened and the etchant resistance of said film can be enhanced.

Next, development is conducted to remove the exposed portion of the photosensitive film and form a resist pattern. It can be conducted by using an alkaline developer, for example, by spraying a dilute aqueous alkali solution on the film to wash off the exposed film portion. As the dilute aqueous alkali solution, there may be used, for example, an aqueous solution of pH 9–13 containing an alkaline substance such as sodium hydroxide, potassium hydroxide, sodium metasilicate, potassium metasilicate, sodium carbonate, ammonia, tetraethylammonium hydroxide or the like.

By the development, a resist pattern is formed on the substrate or the metal.

The resist pattern can be used for formation of a conductor pattern. That is, the conductive film portion or metal portion exposed by the development is removed by etching and then the photosensitive film remaining on the pattern-is removed, whereby a conductor pattern can be formed.

The conductive film portion (non-circuit portion) exposed by the development, i.e. the etching pattern on substrate can be removed by ordinary etching using, for example, an acidic etchant (e.g. a ferric chloride solution) or an alkaline etchant (e.g. an ammonia/ammonium chloride system). Then, the unexposed film portion on circuit pattern is removed, whereby a conductor pattern (e.g. a printed circuit board) can be produced. The removal of the unexposed film portion can be conducted by the use of, for example, a cellosolve type solvent (e.g. ethyl cellosolve or ethyl cellosolve acetate), an aromatic hydrocarbon type solvent (e.g. toluene or xylene), a ketone type solvent (e.g. methyl ethyl ketone or methyl isobutyl ketone), an acetic acid ester type solvent (e.g. ethyl acetate or butyl acetate), or an aqueous strongly alkaline (e.g. sodium hydroxide) solution.

In the thus formed resist pattern, the unexposed resist film portion has a crosslinked structure and accordingly has a high resistance to developer or etchant as compared with conventional positive type electro-deposition photoresists. As a result, the allowable ranges of development conditions are wide; a resist pattern of high contrast can be obtained; the resist film undergoes little damage during etching; and the formed pattern has a high accuracy. Consequently, in the production of printed circuit board of fine pattern or in the fine processing of metal, the image formation step can be controlled easily and an image of very high accuracy can be obtained.

Further, in the present invention, the electro-deposition solution and the high-concentration solution used for make-up of said solution have very high stability and provide an electrocoating bath of excellent running stability. Thus,-the present invention is very useful industrially.

DESCRIPTION OF THE PREFERRED EMBODIMENTS

The present invention is hereinafter described more specifically by way of Examples.

PREPARATION EXAMPLE 1

Preparation of acrylic resin (A)-1

| n-Butyl methacrylate | 223 parts by weight |
| n-Butyl acrylate | 241 parts by weight |
| 2-Hydroxyethyl acrylate | 207 parts by weight |
| Styrene | 200 parts by weight |
| Acrylic acid | 129 parts by weight |
| t-Butyl peroxy-2-ethyl hexanoate | 10 parts by weight |

1,010 parts by weight of the above mixture was dropped, in 4 hours, into 502 parts by weight of propylene glycol monomethyl ether being stirred at 120° C. in a nitrogen current in a reactor. The resulting mixture was kept at the same temperature for 1 hour. Thereinto was dropped, in 1 hour, 20 parts by weight of a solution of 5 parts by weight of t-butyl peroxy-2-ethylhexanoate in 15 parts by weight of propylene glycol monomethyl ether. The resulting mixture was kept at 120° C. for 1 hour and then cooled to obtain a resin solution (A)-1 having a solid content of about 66% by weight. The resin (solid content) had a number-average molecular weight (measured by gel permeation chromatography, the same applies hereinafter) of about 40,000 and contained carboxyl groups in an amount of 1.80 moles per kg of the resin and hydroxyl groups in an amount of 1.80 moles per kg of the resin.

PREPARATION EXAMPLE 2

Preparation of acrylic resin (A)-2

| Methyl methacrylate | 150 parts by weight |
| n-Butyl methacrylate | 365 parts by weight |
| 2-Hydroxyethyl acrylate | 255 parts by weight |
| Styrene | 155 parts by weight |
| Acrylic acid | 75 parts by weight |
| Azobisisobutyronitrile | 7.5 parts by weight |

1,007.5 parts by weight of the above mixture was dropped, in 3 hours, into 651 parts by weight of propylene glycol monomethyl ether/ethylene glycol monobutyl ether (1/1 by weight ratio) being stirred at 90° C. in a nitrogen current in a reactor. The resulting mixture was kept at the same temperature for 2 hours. Thereinto was dropped, in 1 hour, 18 parts by weight of a solution of 3 parts by weight of azobisisobutyronitrile in 15 parts by weight of propylene glycol monomethyl ether. The resulting mixture was kept at 90° C. for 2 hours and then cooled to obtain a resin solution (A)-2 having a solid content of about 60% by weight. The resin (solid content) had a number-average molecular weight of about 53,000 and contained carboxyl groups in an amount of 1.04 moles per kg of the resin and hydroxyl groups in an amount of 2.20 moles per kg of the resin.

PREPARATION EXAMPLE 3

Preparation of acrylic resin (A)-3

| Ethyl acrylate | 150 parts by weight |
| n-Butyl acrylate | 350 parts by weight |
| 2-Hydroxyethyl methacrylate | 115 parts by weight |
| Styrene | 185 parts by weight |
| Methacrylic acid | 200 parts by weight |
| t-Butyl peroxy-2-ethylhexanoate | 15 parts by weight |

1,015 parts by weight of the above mixture was dropped, in 3 hours, into 646 parts by weight of ethylene glycol monobutyl ether being stirred at 120° C. in a nitrogen current in a reactor. The resulting mixture was kept at the same temperature for 1 hour. Thereinto was dropped, in 1 hour, 20 parts by weight of a solution of 5 parts by weight of t-butyl peroxy-2-ethylhexanoate in 15 parts by weight of propylene glycol monomethyl ether. The resulting mixture was kept at 120° C. for 2 hours and then cooled to obtain a resin solution (A)-3 having a solid content of about 60% by weight. The resin (solid content) had a number-average molecular weight of about 28,000 and contained carboxyl groups in an amount of 2.33 moles per kg of the resin and hydroxyl groups in an amount of 0.88 moles per kg of the resin.

PREPARATION EXAMPLE 4

Preparation of acrylic resin (A)-4

| Methyl methacrylate | 100 parts by weight |
| n-Butyl acrylate | 200 parts by weight |
| 2-Hydroxyethyl acrylate | 330 parts by weight |

-continued

| Styrene | 170 parts by weight |
| Acrylic acid | 200 parts by weight |
| t-Butyl peroxy-2-ethyl hexanoate | 15 parts by weight |

1,015 parts by weight of the above mixture was dropped, in 3 hours, into 646 parts by weight of ethylene glycol monobutyl ether being stirred at 120° C. in a nitrogen current in a reactor. The resulting mixture was kept at the same temperature for 1 hour. Thereinto was dropped, in 1 hour, 20 parts by weight of a solution of 5 parts by weight of t-butyl peroxy-2-ethylhexanoate in 15 parts by weight of propylene glycol monomethyl ether. The resulting mixture was kept at 120° C. for 2 hours and then cooled to obtain a resin solution (A)-4 having a solid content of about 60% by weight. The resin (solid content) had a number-average molecular weight of about 32,000 and contained carboxyl groups in an amount of 2.78 moles per kg of the resin and hydroxyl groups in an amount of 2.84 moles per kg of the resin.

PREPARATION EXAMPLE 5

Preparation of acrylic resin (A)-5

| Ethyl acrylate | 185 parts by weight |
| n-Butyl acrylate | 350 parts by weight |
| 2-Hydroxyethyl methacrylate | 90 parts by weight |
| Styrene | 275 parts by weight |
| Methacrylic acid | 100 parts by weight |

| t-Butyl peroxy-2-ethylhexanoate | 15 parts by weight |

1,015 parts by weight of the above mixture was dropped, in 3 hours, into 646 parts by weight of ethylene glycol monobutyl ether being stirred at 120° C. in a nitrogen current in a reactor. The resulting mixture was kept at the same temperature for 1 hour. Thereinto was dropped, in 1 hour, 20 parts by weight of a solution of 5 parts by weight of t-butyl peroxy-2-ethylhexanoate in 15 parts by weight of propylene glycol monomethyl ether. The resulting mixture was kept at 120° C. for 2 hours and then cooled to obtain a resin solution (A)-5 having a solid content of about 60% by weight. The resin (solid content) had a number-average molecular weight of about 25,000 and contained carboxyl groups in an amount of 1.16 moles per kg of the resin and hydroxyl groups in an amount of 0.69 moles per kg of the resin.

EXAMPLES 1–12 AND COMPARATIVE EXAMPLES 1–5

The materials other than deionized water, shown in Table 1 were mixed in accordance with the compounding recipes also shown in Table 1. Each resulting mixture was neutralized with a base to obtain a uniform solution. Each solution was slowly added to a given amount of deionized water being stirred at 1,000–3,000 rpm in a vessel. After the completion of the addition, each resulting mixture was stirred at 500 rpm for 20 minutes to obtain each aqueous dispersion.

TABLE 1-(1)

| Components | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Acrylic resin (a) solution (parts by weight) | A-1 151 | A-2 167 | A-3 167 | A-4 167 | A-4 167 | A-3 167 | A-1 151 | A-2 167 | A-3 167 | A-1 151 | A-4 167 | A-3 167 |
| Vinylphenol resin (b) (parts by weight) | B-1 20 | B-1 15 | B-1 30 | B-2 45 | B-1/3 10/10 | B-1 20 | B-1 20 | B-1 15 | B-1 30 | B-1 5 | B-1/3 10/10 | B-1 10 |
| Ester (c) having quinone diazide group (parts by weight) | C-1 15 | C-2 10 | C-3 20 | C-1 35 | C-1 15 | C-1 15 | C-1 5 | C-2 7 | C-3 5 | C-1 5 | C-1 8 | C-1 7.5 |
| Basic compound (parts by weight) | Et3N 9.1 | DMAE 6.5 | Et3N 10.1 | ← 15.2 | ← 12.1 | ← 8.1 | ← 9.1 | DMAE 6.5 | Et3N 10.1 | ← 10.1 | ← 12.1 | ← 8.1 |
| Organic solvent(s) (parts by weight) | S-1 30 | S-2 20 | S-1 30 | S-1 40 S-3 30 | S-1 30 S-4 30 | S-1 30 | S-1 30 | S-2 20 | S-1 30 | S-1 20 S-3 30 | S-1 30 S-4 20 | S-1 30 |
| Additives (parts by weight) | D-1 1.0 | | D-1 1.5 | D-1 1.0 D-2 3.0 | D-1 0.5 | D-1 0.5 | D-1 1.0 | | D-1 1.5 | D-1 1.0 D-2 3.0 | D-1 0.5 | D-1 0.5 |

| Components | Comparative Examples | | | | |
|---|---|---|---|---|---|
| | 1 | 2 | 3 | 4 | 5 |
| Acrylic resin (a) solution (parts by weight) | A-1 151 | A-4 167 | A-4 167 | A-2 167 | A-5 167 |
| Vinylphenol resin (b) (parts by weight) | | B-2 70 | B-1 25 | B-1 45 | B-1 35 |
| Ester (c) having quinone diazide group (parts by weight) | C-1 13 | C-2 20 | C-3 60 | C-1 35 | C-1 20 |
| Basic compound (parts by weight) | Et3N 8.1 | ← 15.2 | ← 15.2 | DMAE 4.9 | ← 6.6 |
| Organic solvent(s) | S-1 | S-3 | S-1 | S-3 | S-1 |

TABLE 1-(1)-continued

| (parts by weight) | 20 | 50 | 30 | 40 | 30 |
|---|---|---|---|---|---|
| | | S-4 | S-3 | S-4 | S-4 |
| | | 40 | 50 | 40 | 30 |
| Additives | D-1 | D-1 | D-1 | D-1 | D-1 |
| (parts by weight) | 1.0 | 1.0 | 1.0 | 1.0 | 1.0 |
| | | D-2 | D-2 | D-2 | D-2 |
| | | 3.0 | 3.0 | 3.0 | 3.0 |

TABLE 1-(2)

| Components | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Deionized water (parts by weight) | 213 | 94 | 140 | 384 | 205 | 188 | 200 | 191 | 112 | 224.9 | 189 | 169 |
| Solid content (% by weight) | 30 | 40 | 35 | 25 | 30 | 30 | 30 | 30 | 35 | 25 | 30 | 30 |
| Amount of (b) in (a) + (b) + (c) = 1,000 parts by weight (parts by weight) | 148 | 120 | 200 | 250 | 148 | 80 | 160 | 123 | 222 | 45 | 156 | 85 |
| Amount of (c) in (a) + (b) + (c) = 1,000 parts by weight (parts by weight) | 111 | 80 | 133 | 194 | 111 | 120 | 40 | 57 | 37 | 45 | 63 | 64 |
| Moles of carboxyl group(s) in (a) + (b) + (c) = 1,000 g | 1.33 | 0.83 | 1.55 | 1.54 | 2.06 | 1.86 | 1.43 | 0.85 | 1.72 | 1.63 | 2.17 | 1.97 |
| Moles of non-phenolic hydroxyl group(s) in (a) + (b) + (c) = 1,000 g | 1.33 | 1.76 | 0.59 | 1.58 | 2.10 | 0.70 | 1.42 | 1.80 | 0.74 | 1.63 | 2.22 | 0.85 |

| Components | Comparative Examples | | | | |
|---|---|---|---|---|---|
| | 1 | 2 | 3 | 4 | 5 |
| Deionized water (parts by weight) | 184 | 394 | 389 | 384 | 224 |
| Solid content (% by weight) | 30 | 25 | 25 | 25 | 30 |
| Amount of (b) in (a) + (b) + (c) = 1,000 parts by weight (parts by weight) | 0 | 368 | 135 | 250 | 224 |
| Amount of (c) in (a) + (b) + (c) = 1,000 parts by weight (parts by weight) | 115 | 105 | 324 | 194 | 156 |
| Moles of carboxyl group(s) in (a) + (b) + (c) = 1,000 g | 1.59 | 1.46 | 1.50 | 0.58 | 0.75 |
| Moles of non-phenolic hydroxyl group(s) in (a) + (b) + (c) = 1,000 g | 1.59 | 1.49 | 1.54 | 1.22 | 0.44 |

In Table 1, various symbols refer to the followings.

B-1: a homopolymer of p-vinylphenol, a product of Maruzen Petrochemical Co. having a trade name of "Marukalyncur M", Mw=4,500

B-2: a copolymer of p-vinylphenyl/n-butyl acrylate (34/66 by weight ratio), a product of Maruzen Petrochemical Co. having a trade name of "Marukalyncur CBA", Mw=13,000

B-3: a copolymer of p-vinylphenyl/styrene (50/50 by weight ratio), a product of Maruzen Petrochemical Co. having a trade name of "Marukalyncur CST", Mw=5,000

C-1: an esterification product between 1,2-naphthoquinonediazide-5-sulfonic acid chloride and 2,3,4-trihydroxybenzophenone (2.0/1.0 by molar ratio)

C-2: an esterification product between 1,2-naphthoquinonediazide-5-sulfonic acid chloride and 2,3,4-trihydroxybenzophenone (2.5/1.0 by molar ratio)

C-3: an esterification product between 1,2-benzoquinonediazide-4-sulfonic acid chloride and 2,3,4,4'-tetrahydroxybenzophenone (3.0/1.0 by molar ratio)

Et3N: triethylamine

DMAE: dimethylaminoethanol

S-1: ethylene glycol dimethyl ether

S-2: ethylene glycol dibutyl ether

S-3: benzyl alcohol (hydrophobic solvent)

S-4: ethylene glycol monohexyl ether (hydrophobic solvent)

D-1: benzotriazole

D-2: polyethylene glycol monononylphenol ether (HLB=14)

TEST EXAMPLE 1

Each of the aqueous dispersions of Examples 1–12 and Comparative Examples 1–5 was placed in a closed vessel and allowed to stand for 1 hour and also for 90 days, each at 35° C. Then, the condition of each contents was observed. The results are shown in Table 2.

TABLE 2

| | After 1 hour | After 90 days |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Example 9 | Good | Good |
| Example 10 | Good | Good |
| Example 11 | Good | Good |
| Example 12 | Good | Good |
| Comparative Example 1 | Good | Custard pudding-like |
| Comparative Example 2 | Slight deposition | Separation into two layers |
| Comparative Example 3 | Slight deposition | Separation into two layers |
| Comparative Example 4 | Hard caking | Separation and hard caking |
| Comparative Example 5 | Good | Hard caking |

TEST EXAMPLE 2

Each of the aqueous dispersions of Examples 1–12 and Comparative Examples 1–5 was diluted with deionized water so that the solid content after dilution became 8% by weight, whereby various electrodeposition solutions were prepared. Each solution was subjected to the same test as in Test Example 1. The results are shown in Table 3.

TABLE 3

| | After 1 hour | After 90 days |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Example 9 | Good | Good |
| Example 10 | Good | Good |
| Example 11 | Good | Good |
| Example 12 | Good | Good |
| Comparative Example 1 | Good | Separation into two layers |
| Comparative Example 2 | Deposition | Separation into two layers |
| Comparative Example 3 | Deposition | Separation into two layers |
| Comparative Example 4 | Hard caking | Separation and hard caking |
| Comparative Example 5 | Good | Hard caking |

Each electrodeposition solution was placed in a 100 l electrodeposition tank equipped with a mechanically sealed centrifugal pump and a cartridge filter having a pore diameter of 10 m, and stirred at 30° C. for 90 days at a circulation rate of 10 turnovers per hour.

No abnormality was seen in the solutions of Examples 1–12 and Comparative Example 5; however, the solutions of Comparative Examples 2–4 caused severe filter plugging within 2 days from the start of stirring and made the circulation impossible. Similarly, the solution of Comparative Example 1 caused severe filter plugging at about 15 days from the start of stirring and made the circulation impossible in 60 days.

TEST EXAMPLE 3

Electrodeposition was conducted in each electrodeposition bath of the electrodeposition solutions prepared in Text Example 2 using the aqueous dispersions of Examples 1–12 and Comparative Examples 1–5, under the conditions shown in Table 4, using, as an anode, a copper-clad glass fiber-reinforced epoxy resin laminate wherein the copper layer thickness were 45μm and 75 μm and which had through-holes plated with copper inside, having diameters of 1.0–0.3 mm. The results are shown in Table 4.

TABLE 4

| | Current density (mA/dm$^2$) | Electro-deposition time (sec) | Film thickness (μm) | Film state |
|---|---|---|---|---|
| Example 1 | 50 | 60 | 6.3 | Good |
| Example 2 | 45 | 60 | 7.5 | Good |
| Example 3 | 60 | 50 | 5.6 | Good |
| Example 4 | 55 | 70 | 5.1 | Good |
| Example 5 | 45 | 70 | 10.2 | Good |
| Example 6 | 45 | 45 | 5.8 | Good |
| Example 7 | 50 | 60 | 5.5 | Good |
| Example 8 | 45 | 60 | 6.5 | Good |
| Example 9 | 60 | 50 | 5.6 | Good |
| Example 10 | 55 | 70 | 6.1 | Good |
| Example 11 | 45 | 70 | 9.3 | Good |
| Example 12 | 45 | 50 | 6.8 | Good |
| Comparative Example 1 | 45 | 50 | 7.1 | Good |
| Comparative Example 2 | 55 | 60 | 6.2 | Abnormal deposition |
| Comparative Example 3 | 55 | 60 | 6.6 | Abnormal deposition |
| Comparative Example 4 | Electro-deposition impossible | — | — | — |
| Comparative Example 5 | 60 | 50 | 5.8 | Good |

Abnormal deposition: seedings and pinholes are seen on the surface.

Conditions

Bath temperature: 27° C.

Stirring: 5 turnovers per hour

Each substrate after electrodeposition was washed with water and then dried at 80° C. for 10 minutes.

TEST EXAMPLE 4

A photomask was tightly adhered to each of the substrates after electrodeposition, obtained in Test Example 3 using the aqueous dispersions of Examples 1–12 and Comparative Examples 1, 2, 3 and 5. The photomask was made of a polyethylene terephthalate film and had a test pattern having, at the portions corresponding to the portion of substrate other than through-holes, a line pattern of 30 (line)/30 (width) μm to 200/200 μm at intervals of 10 μm (from 30/30 μm to 100/100 μm) and 25 μm (from 100/100 μm to 200/200 μm). Each substrate having a photomask thereon was irradiated with an ultra-high-pressure mercury lamp, heated, and subjected to development and etching, under the conditions shown in Table 5. The results are shown in Table 5.

TABLE 5

| | Heating after irradiation | | Deve- | Development conditions | | Resolution L/S | Sensi- tivity | Etching property | | | |
|---|---|---|---|---|---|---|---|---|---|---|---|
| | | | | | | | | Copper thickness 45 µm | | Copper thickness 75 µm | |
| | °C. | min | loper | Temp. °C. | Time sec | (line/space) | (mj/cm²) | Pattern | Through -hole | Pattern | Through -hole |
| Example 1 | 130 | 10 | 1 | 25–45 | 60–210 | 30/30 | 70 | 5 | O | 5 | O |
| Example 2 | 140 | 10 | 1 | 30–45 | 75–240 | 30/30 | 60 | 5 | O | 5 | O |
| Example 3 | 150 | 3 | 2 | 25–45 | 60–240 | 30/30 | 90 | 5 | O | 5 | O |
| Example 4 | 120 | 10 | 1 | 30–50 | 75–300 | 30/30 | 110 | 3 | O | 5 | O |
| Example 5 | 130 | 15 | 2 | 25–45 | 60–240 | 30/30 | 70 | 5 | O | 5 | O |
| Example 6 | 140 | 5 | 1 | 25–45 | 60–240 | 30/30 | 70 | 5 | O | 5 | O |
| Example 7 | 130 | 10 | 1 | 30–40 | 60–210 | 30/30 | 35 | 5 | O | 5 | O |
| Example 8 | 140 | 10 | 1 | 35–40 | 75–240 | 30/30 | 45 | 5 | O | 5 | O |
| Example 9 | 150 | 3 | 2 | 25–40 | 60–240 | 30/30 | 40 | 5 | O | 5 | O |
| Example 10 | 120 | 10 | 1 | 30–40 | 75–300 | 30/30 | 45 | 3 | O | 5 | O |
| Example 11 | 130 | 15 | 2 | 25–35 | 60–240 | 30/30 | 50 | 5 | O | 5 | O |
| Example 12 | 140 | 5 | 1 | 25–35 | 60–240 | 30/30 | 50 | 5 | O | 5 | O |
| Comparative Example 1 | 140 | 10 | 1 | 25–30 | 60–90 | 100/100 | 80 | 10 | O | 30 | P |
| Comparative Example 2 | 130 | 10 | 1 | 45–60 | 150–300 | 100/100* | 130 | 5 | S | 5 | P |
| Comparative Example 3 | 130 | 10 | 1 | 30–50 | 75–270 | 120/120* | 160 | 5 | P | 7 | P |
| Comparative | 130 | 10 | 1 | 50–60 | 180–300 | 100/100 | 90 | 5 | O | 5 | O |

The substrates after electrodeposition, obtained in Text Example 3 using the aqueous dispersions of Examples 1–12 were treated in the same manner as above, except that no heating after irradiation was conducted. The results are shown in Table 6 as those of Comparative Examples 6–17.

Developer 1: a 0.7% aqueous sodium carbonate solution
Developer 2: a 1.5% aqueous sodium metasilicate solution
Resolution: a smallest L/s at which the reproducibility of resist pattern L/S is within 5%.
Development conditions

TABLE 6

| | Resist used | Deve- loper | Development conditions | | Resolution L/S | Sensi- tivity | Etching property | | | |
|---|---|---|---|---|---|---|---|---|---|---|
| | | | | | | | Copper thickness 45 µm | | Copper thickness 75 µm | |
| | | | Temp. °C. | Time sec | (line/space) | (mj/cm²) | Pattern | Through -hole | Pattern | Through -hole |
| Comparative Example 6 | Example 1 | 1 | 25–35 | 60–120 | 50/50 | 70 | 10 | VS | 20 | P |
| Comparative Example 7 | Example 2 | 1 | 30–40 | 60–120 | 60/60 | 60 | 15 | VS | 25 | P |
| Comparative Example 8 | Example 3 | 2 | 25–35 | 60–150 | 50/50 | 90 | 10 | S | 20 | P |
| Comparative Example 9 | Example 4 | 1 | 30–40 | 75–180 | 50/50 | 110 | 20 | S | 30 | P |
| Comparative Example 10 | Example 5 | 2 | 25–35 | 60–180 | 60/60 | 70 | 15 | VS | 20 | P |
| Comparative Example 11 | Example 6 | 1 | 25–35 | 60–180 | 50/50 | 70 | 15 | VS | 25 | P |
| Comparative Example 12 | Example 7 | 1 | 30–40 | 60–120 | 50/50 | 35 | 10 | VS | 20 | P |
| Comparative Example 13 | Example 8 | 1 | 35–40 | 60–120 | 60/60 | 45 | 15 | VS | 25 | P |
| Comparative Example 14 | Example 9 | 2 | 25–40 | 60–150 | 50/50 | 40 | 10 | S | 20 | P |
| Comparative Example 15 | Example 10 | 1 | 30–40 | 75–180 | 50/50 | 45 | 20 | S | 30 | P |
| Comparative Example 16 | Example 11 | 2 | 25–35 | 60–180 | 60/60 | 50 | 15 | VS | 20 | P |
| Comparative Example 17 | Example 12 | 1 | 25–35 | 60–180 | 50/50 | 50 | 15 | VS | 25 | P |

Notes for Table 5 and Table 6
Exposure: 200 mj/cm²

Examples 1–12:30° C.×75 seconds and 40° C.×180 seconds

Comparative Example 1:30° C.×75 seconds 2:50° C.×210 seconds 3:40° C.×180 seconds 5:50° C.×210 seconds Comparative Examples 6–17: 30° C.×75 seconds and 35° C.×120 seconds The development conditions in Table 5 and Table 6 show ranges of development conditions under which there is no resist pattern defect (cutting, strain, peeling). * indicates that the formed resist pattern has partial defect.

Sensitivity: the same development conditions as in resolution were used. Is indicated as an exposure (mj/cm$^2$) required for obtaining five steps of the Step Tablet (a product of Eastman Kodak, 21 steps).

Etching property:

Exposure: 200 mj/cm$^2$

Etchant: a cupric chloride type etchant

Etching conditions: Temperature: 50° C. Time: 1.5 times the minimum time required for complete etching of resist film-free substrate.

Pattern: a width reduction (μm) by etching of 100 μm pattern

| | Through-holes: |
|---|---|
| O: | copper plated inside each through-hole has no abnormality. |
| VS: | there are through-holes in which the plated copper is slightly attacked chemically. |
| S: | in 3% or less of through-holes, the plated copper is partially attacked chemically and there is no condition. |
| P: | in 10% or more of through-holes, the plated copper is chemically attacked and there is no condition. |

In all the samples tested above, the respective resist films (including those inside through-holes) could be peeled off in 180 seconds or less, by spraying a 1% aqueous sodium hydroxide solution of 50° C. on the samples.

TEST EXAMPLE 5

Using the electrodeposition solution obtained using the aqueous dispersion of Example 5, a resist film was formed on the both sides of a copper foil of 200μm in thickness, under the same conditions as in Test Example 3. Onto each side of the film-formed copper foil was tightly adhered a photomask made of a polyethylene terephthalate film, having a pattern of 60 (line)/60 (space) μm, so as to give a mirror surface symmetry. The resulting material was irradiated at an exposure of 200 mj/cm$^2$ using an ultrahigh-pressure mercury lamp and then subjected to the same development, etching and resist film removal as in Test Example 4, whereby a good pattern having a line width reduction of 10% or less was obtained.

As described above, the electrodeposition photoresist composition of the present invention is a positive type anionic electrodeposition photoresist having excellent properties and can be produced easily at a low cost by mixing the components (A), (B) and (C) at particular proportions.

According to the process for pattern formation according to the present invention, there can be formed a resist film pattern of very high etchant resistance without impairing the resolution. In a thick copper circuit substrate, there can be obtained an etching pattern without impairing the shape of conductor circuit formed and the copper plating inside through-holes.

By utilizing the very high etchant resistance, the electrodeposition photoresist composition of the present invention can be used in metal processing such as formation of TAB tape or lead frame each having a high-density pattern.

What is claimed is:

1. A positive anionic electrodeposition photoresist composition comprising, as a main component, a water-dispersible resin composition obtained by neutralizing, with a base, an admixture comprising:

(A) an acrylic resin containing carboxyl group(s) in an amount of 0.7–3.5 moles per kg of the resin and hydroxyl group(s) in an amount of 0.5–3.5 moles per kg of the resin and having a number-average molecular weight of 10,000–100,000, (B) a vinylphenol resin containing a unit represented by formula (I)

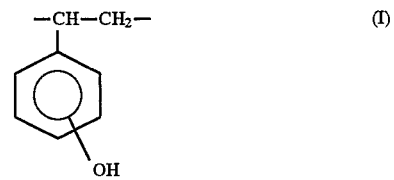

in an amount of at least 25% by weight based on the resin and having a number-average molecular weight of 1,000–25,000, said vinylphenol resin being free from a photosensitive o-quinone diazide residue, and (C) an ester between a polyhydroxybenzophenone and 1,2-naphthoquinone diazide sulfonic acid or benzoquinone diazide sulfonic acid, and dispersing the resulting neutralization product in water.

2. A positive anionic electrodeposition photoresist composition comprising, as a main component, a water-dispersible resin composition obtained by neutralizing, with a base, an admixture comprising:

(A) an acrylic resin containing carboxyl group(s) in an amount of 0.7–3.5 moles per kg of the resin and hydroxyl group(s) in an amount of 0.5–3.5 moles per kg of the resin and having a number-average molecular weight of 10,000–100,000, (B) a vinylphenol resin selected from the group consisting of homopolymers of hydroxystyrene and copolymers of hydroxystyrene and other copolymerizable monomers selected from the group consisting of $C_{1-18}$ alkyl or cycloalkyl esters of (meth)acrylic acid, vinyl aromatic compounds, polymerizable amides, polymerizable nitriles, vinyl esters, propenyl esters and monomers of the formula

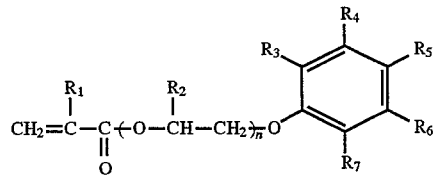

wherein n is an integer of 1–9, $R_1$ and $R_2$ are each a hydrogen atom or a methyl group, $R_3$ to $R_7$ are each a hydrogen atom, an alkyl group of 1–10 carbon atoms, a benzyl group or a halogen atom, and (C) an ester between a polyhydroxybenzophenone and 1,2-naphthoquinone diazide sulfonic acid or benzoquinone diazide sulfonic acid, and dispersing the resulting neutralization product in water.

3. The composition set forth in claim 1, wherein the acrylic resin (A) contains carboxyl group(s) in an amount of 1.0–2.5 moles per kg of the resin and hydroxyl group(s) in an amount of 0.75–3.2 moles per kg of the resin.

4. The composition set forth in claim 1, wherein the acrylic resin (A) has a number-average molecular weight of 20,000–70,000.

5. The composition set forth in claim 1, wherein the vinylphenol resin (B) contains a unit of formula (I) in an amount of 30–100% by weight based on the resin.

6. The composition set forth in claim 1, wherein the vinylphenol resin (B) has a number-average molecular weight of 2,500–20,000.

7. The composition set forth in claim 1, wherein the vinylphenol resin (S) is a homopolymer of hydroxystyrene or a copolymer between hydroxystyrene and other copolymerizable monomer.

8. The composition set forth in claim 1, wherein the polyhydroxybenzophenone is represented by formula (II)

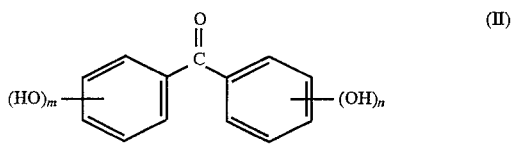

wherein m and n are each an integer of 0–3 with the total of m and n being 1–6.

9. The composition set forth in claim 8, wherein the polyhydroxybenzophenone is selected from the group consisting of 2,3,4-trihydroxybenzophenone and 2,3,4,4'-tetrahydroxybenzophenone.

10. The composition set forth in claim 1, wherein the 1,2-naphthoquinone diazide sulfonic acid and the benzoquinone diazide sulfonic acid are represented by formula (III) and formula (IV), respectively:

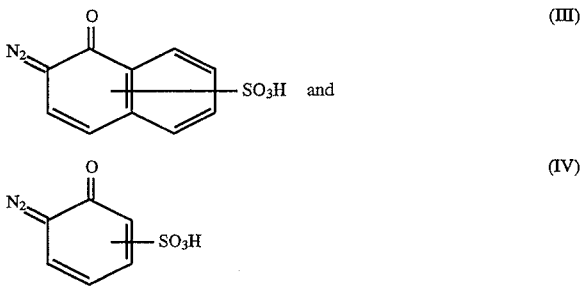

11. The composition set forth in claim 10, wherein the 1,2-naphthoquinone diazide sulfonic acid is 1,2-naphthoquinone diazide-5-sulfonic acid or 1,2-naphthoquinone diazide-4-sulfonic acid and the benzoquinone diazide sulfonic acid is 1,2-benzoquinone diazide-4-sulfonic acid.

12. The composition set forth in claim 1, which comprises the vinylphenol resin (B) in an amount of 5–550 parts by weight per 1,000 parts by weight of the total of the components (A), (B) and (C).

13. The composition set forth in claim 1, which comprises the quinone diazide sulfonic acid ester (C) in an amount of 15–450 parts by weight per 1,000 parts by weight of the total of the components (A), (B) and (C).

14. The composition set forth in claim 1, which comprises carboxyl group(s) in an amount of 0.33–3.3 moles per 1,000 g of the total of the components (A), (B) and (C).

15. The composition set forth in claim 1, which comprises carboxyl group(s) in an amount of 0.5–2.5 moles per 1,000 g of the total of the components (A), (B) and (C).

16. The composition set forth in claim 1, which comprises carboxyl group(s) and non-phenolic hydroxyl group(s) in a total amount of 0.6–6 moles per 1,000 g of the total of the components (A), (B) and (C).

17. The composition set forth in claim 1, which comprises carboxyl group(s) and non-phenolic hydroxyl group(s) in a total amount of 0.6–4.5 moles per 1,000 g of the total of the components (A), (B) and (C).

18. The composition set forth in claim 1, which further comprises an organic solvent.

19. The composition set forth in claim 1, which has a solid content of 3–40% by weight.

20. A process for formation of resist pattern, which comprises:

(a) a step of electrocoating the electrodeposition photoresist composition set forth in claim 1, on a substrate having a conductive film thereon or on a metal to form a positive photosensitive film, (b) a step of irradiating the positive photosensitive film with a light via a pattern mask, (c) a step of heating the light-irradiated photosensitive film, and (d) a step of removing the light-irradiated portion of the film with an alkaline developer to form a pattern.

21. A process for formation of conductor pattern, which comprises:

(a) a step of electrocoating the electrodeposition photoresist composition set forth in claim 1, on a substrate having a conductive film thereon or on a metal to form a positive photosensitive film, (b) a step of irradiating the positive photosensitive film with a light via a pattern mask, (c) a step of heating the light-irradiated photosensitive film, (d) a step of removing the light-irradiated portion of the film with an alkaline developer to form a pattern, (e) a step of removing the exposed conductive film or the exposed metal by etching, and (f) a step of removing the photosensitive film remaining on the pattern.

22. A pattern formed by the process set forth in claim 20.

23. A pattern formed by the process set forth in claim 21.

* * * * *